United States Patent
Lin et al.

(10) Patent No.: US 10,079,311 B2
(45) Date of Patent: Sep. 18, 2018

(54) THIN FILM TRANSISTOR SUBSTRATE AND METHOD FOR MAKING SAME

(71) Applicant: HON HAI PRECISION INDUSTRY CO., LTD., New Taipei (TW)

(72) Inventors: Hsin-Hua Lin, New Taipei (TW); Yi-Chun Kao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/666,570

(22) Filed: Aug. 2, 2017

(65) Prior Publication Data

US 2018/0040736 A1     Feb. 8, 2018

Related U.S. Application Data

(60) Provisional application No. 62/370,733, filed on Aug. 4, 2016.

(51) Int. Cl.
*H01L 29/78* (2006.01)
*H01L 29/786* (2006.01)
*H01L 29/66* (2006.01)
*H01L 29/24* (2006.01)

(52) U.S. Cl.
CPC .......... *H01L 29/7869* (2013.01); *H01L 29/24* (2013.01); *H01L 29/66969* (2013.01); *H01L 29/78696* (2013.01)

(58) Field of Classification Search
CPC ................ H01L 29/7869; H01L 29/24; H01L 29/66969; H01L 29/78696
See application file for complete search history.

(56) References Cited

U.S. PATENT DOCUMENTS

| | | | |
|---|---|---|---|
| 8,624,237 B2 * | 1/2014 | Yamazaki | H01L 27/1225 257/43 |
| 8,624,245 B2 * | 1/2014 | Yamazaki | H01L 27/1225 257/59 |
| 8,766,250 B2 * | 7/2014 | Miyanaga | H01L 29/7869 257/43 |
| 2011/0114942 A1 * | 5/2011 | Akimoto | H01L 29/45 257/43 |
| 2016/0329433 A1 * | 11/2016 | Zhuang | H01L 29/41733 |

* cited by examiner

*Primary Examiner* — Fernando L Toledo
*Assistant Examiner* — Neil Prasad
(74) *Attorney, Agent, or Firm* — ScienBiziP, P.C.

(57) ABSTRACT

A TFT substrate includes a substrate and a plurality of TFTs on the substrate. Each TFT includes a channel layer, a source electrode and a drain electrode on opposite sides of the channel layer. An ohmic contact layer is applied between the channel layer and the source electrode, and between the channel layer and the drain electrode. Both the channel layer and the ohmic contact layer are made of a metal oxide containing zinc. The channel layer has a zinc atomic percentage of less than 35%, and the ohmic contact layer has a zinc atomic percentage of more than 65%.

15 Claims, 11 Drawing Sheets

THIN FILM TRANSISTOR SUBSTRATE AND
METHOD FOR MAKING SAME

FIELD

The subject matter herein generally relates to a thin film transistor (TFT) substrate and method for making the TFT substrate.

BACKGROUND

A display panel usually includes a thin film transistor (TFT) substrate. The TFT substrate usually has a substrate and a plurality of TFTs formed on the substrate. Each TFT has a gate electrode, a semiconductor layer, a gate insulator layer disposed between the gate electrode and the semiconductor layer, a drain electrode and a source electrode electrically coupled to opposite sides of the semiconductor layer. However, a resistance is formed between the semiconductor layer and the drain electrode/the source electrode.

BRIEF DESCRIPTION OF THE DRAWINGS

Implementations of the present technology will now be described, by way of example only, with reference to the attached figures.

DETAILED DESCRIPTION

Figure 1:
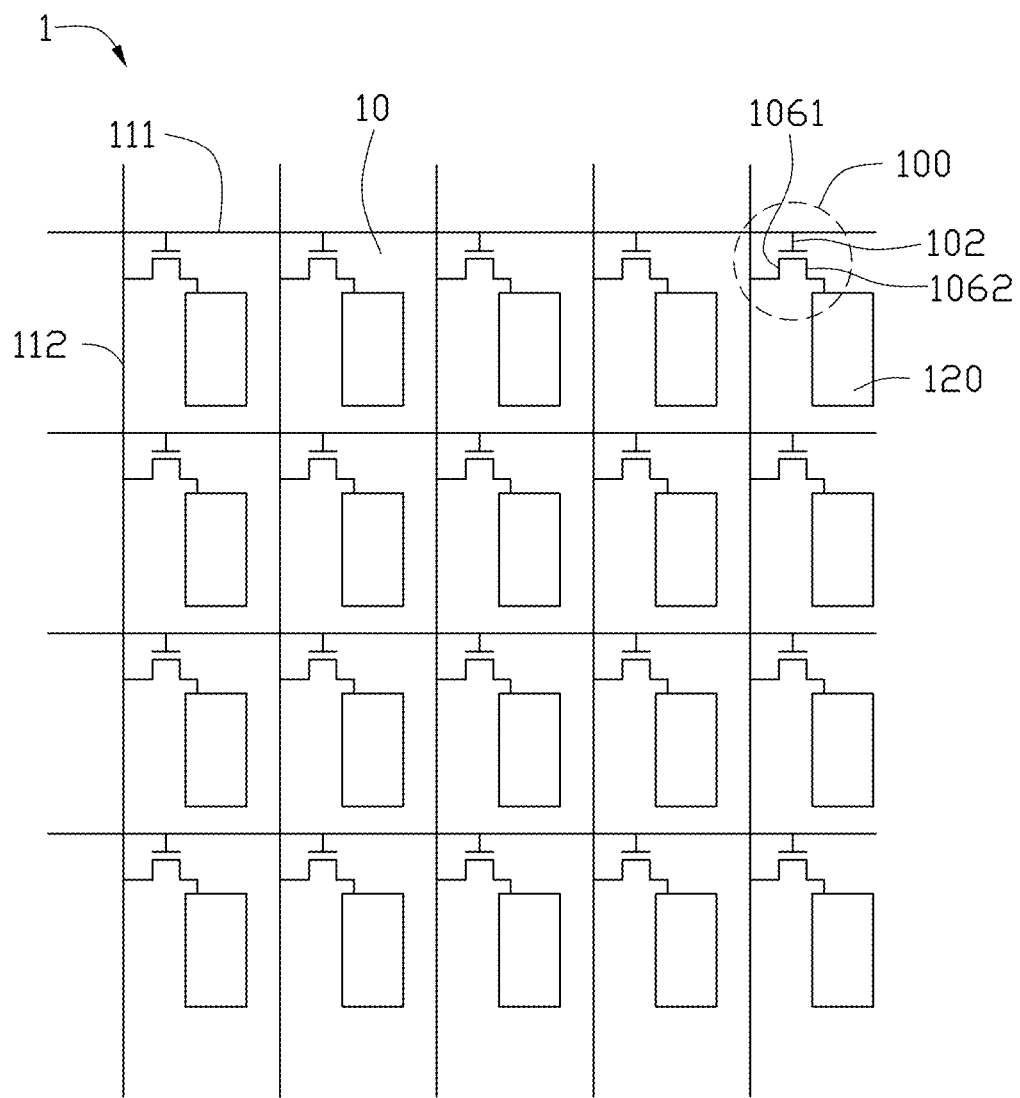
FIG. 1 is a circuit layout of a first exemplary embodiment of a TFT substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

Figure 2:
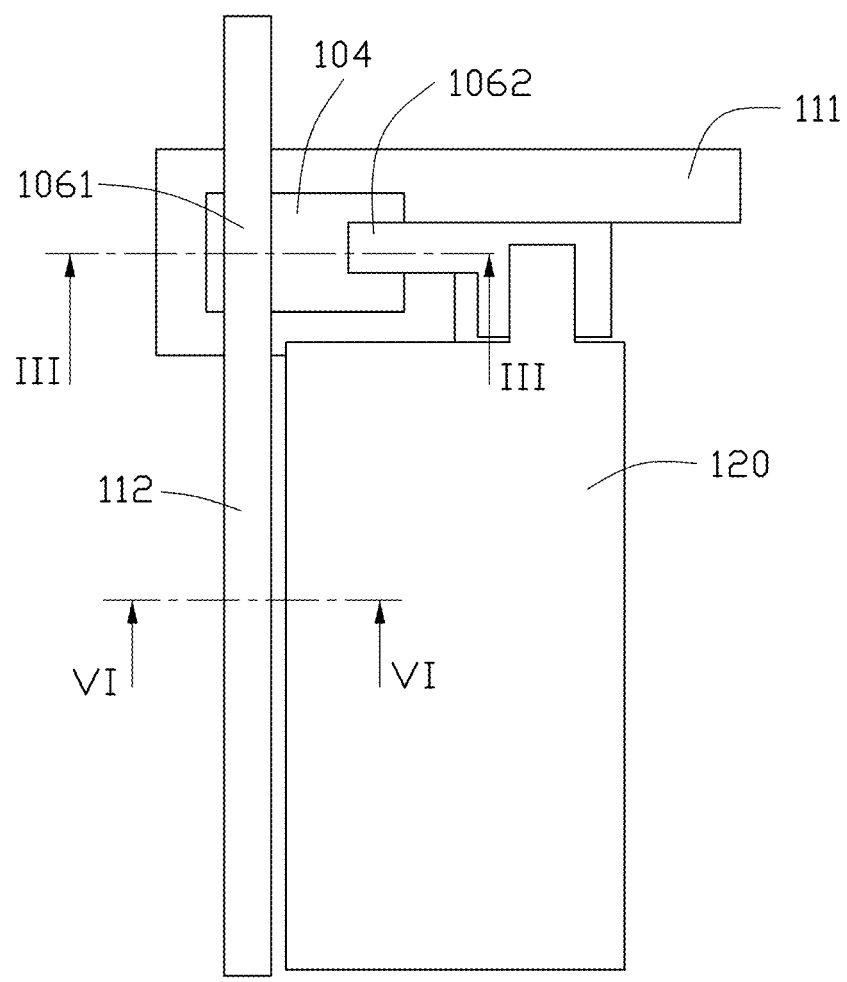
FIG. 2 is a planar and partial view of the TFT substrate of FIG. 1.

FIG. 1 and FIG. 2 illustrate a TFT substrate 1 according to a first exemplary embodiment. The TFT substrate 1 includes a plurality of parallel scan lines 111 and a plurality of parallel data lines 112. The TFT substrate 1 further includes a plurality of pixel units 10 defined by the scan lines 111 and the data lines 112 which cross the scan lines 111. The pixel units 10 are arranged in an array.

In the present exemplary embodiment, the TFT substrate 1 is applied in a display device (not shown). In other embodiments, the TFT substrate 1 may be applied in other electronic device, such as a fingerprint identification device. As shown in FIG. 1, at least one TFT 100 and at least one pixel electrode 120 are positioned in each pixel unit 10. Each TFT 100 includes a gate electrode 102, a source electrode 1061, and a drain electrode 1062. The gate electrode 102 is electrically coupled to one of the scan lines 111; the source electrode 1061 is electrically coupled to one of the data lines 112; and the drain electrode 1062 is electrically coupled to the pixel electrode 120. The pixel electrode 120 and a common electrode (not shown) cooperatively form an electric field for rotating liquid crystals of the display device (not shown). The TFT 100 functions as a switch to control the pixel electrode 120.

Figure 3:
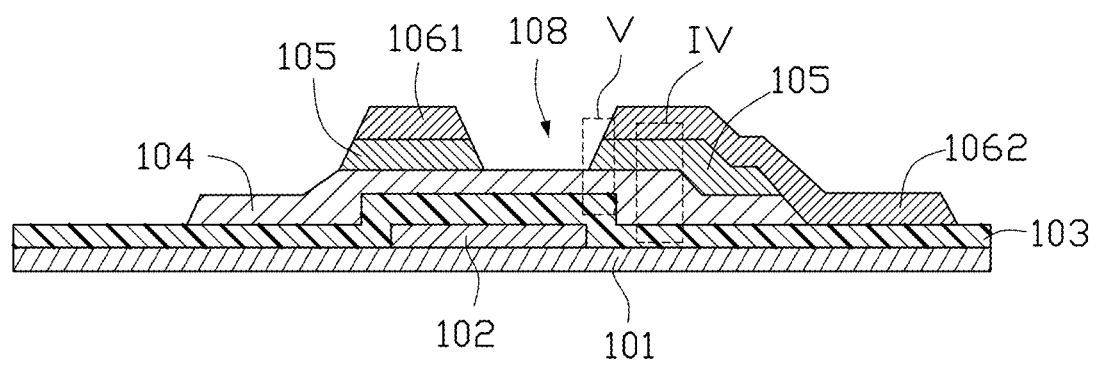
FIG. 3 is a cross-sectional view of a first exemplary embodiment of the TFT substrate of FIG. 2 along line III-III.

As shown in FIG. 3, the TFT substrate 1 further includes a substrate 101, the TFTs 100 are formed on the substrate 101. Each TFT 100 further includes a gate insulating layer 103 and a channel layer 104, and an ohmic contact layer 105. The gate electrode 102 is formed on the substrate 101 and the gate insulating layer 103 is also formed on the substrate 101. The gate insulating layer 103 covers the gate electrode 102. The channel layer 104 is formed on the gate insulating layer 103 and corresponds to the gate electrode 102 and the source electrode 1061 and the drain electrode 1062 are formed on the channel layer 104 and located at opposite sides of the channel layer 104. The ohmic contact layer 105 is positioned between the source electrode 1061 and the channel layer 104 and between the drain electrode 1062 and the channel layer 104.

The source electrode 1061 and the drain electrode 1062 are spaced apart from each other by a groove 108. The groove 108 extends through the ohmic contact layer 105 to expose the channel layer 104. The groove 108 tapers along a direction facing towards the channel layer 104. An open end of the groove 108 away from the channel layer 104 has a size greater than a size of an bottom end of the groove 108 adjacent to the channel layer 104. In the present exemplary embodiment, the drain electrode 1062 extends along a side of the ohmic contact layer 105 and the channel layer 104 away from the groove 108 and covers the gate insulating layer 103. The drain electrode 1062 is in direct contact with the channel layer 104.

The substrate 101 may be made of a transparent glass, a transparent quartz, or a transparent plastic. In other embodiments, the substrate 101 may be made of ceramic or silicon materials. The substrate 101 may be made of a flexible material. For example, the substrate 101 may be made of polyethersulfone (PES), polyethylene naphthalate (PEN), polyethylene (PE), polyimide (PI), polyvinyl chloride (PVC), or polyethylene terephthalate (PET).

The gate electrode 102 and the scan lines 111 may be defined in one first conductive layer (not shown) and be formed by etching the first conductive layer. The first conductive layer may be made of one or more materials selected from a group consisting of aluminum (Al), silver (Ag), gold (Au) Cobalt (Co), chromium (Cr), copper (Cu), indium (In), manganese (Mn), molybdenum (Mo), nickel (Ni), neodymium (Nd), palladium (Pd), titanium (Ti), tungsten (W), and zinc (Zn). In other embodiments, the first conductive layer may be made of a transparent conductive material, such as indium tin oxide (ITO) or aluminum zinc oxide (AZO).

The source electrode 1061, the drain electrode 1062, and the data lines 112 may be defined by a same second conductive layer 106 (shown in FIG. 10) and be formed by etching the second conductive layer 106. The second conductive layer 106 may be made of one or more materials selected from a group consisting of Al, Ag, Au, Co, Cr, Cu, In, Mn, Mo, Ni, Nd, Pd, Ti, W, and Zn. In the present exemplary embodiment, the source electrode 1061, the drain electrode 1062, and the data lines 112 are made of copper.

Figure 6:
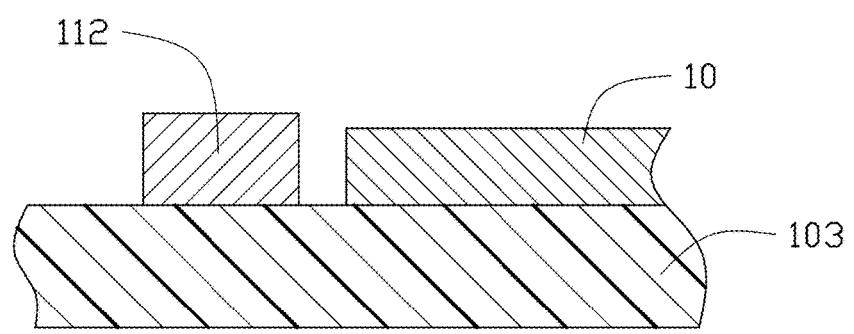
FIG. 6 is a cross-sectional view of the TFT substrate of FIG. 2 along line VI-VI.

As shown in FIG. 6, the data line 112 is in direct contact with the gate insulating layer 103.

The gate insulating layer 103 is configured to protect the gate electrode 102 from electrical connection with other conductive portions of the TFT substrate 1. The gate insulating layer 103 may be made of one or more materials selected from a group consisting of silicon oxide (SiOx), silicon nitride (SiNx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate ($BaTiO_3$), and lead titanate ($PbTiO_3$). In the present exemplary embodiment, the gate insulating layer 103 may be a single layer, but is not limited to being a single layer; the gate insulating layer 103 may comprise double layers or more than two layers.

The channel layer 104 is made of a metal oxide semiconductor material containing zinc. The metal oxide semiconductor material containing zinc may be amorphous, crystalline, or polycrystalline. The channel layer 104 may be made of a metal oxide semiconductor material containing not only zinc but also at least one of indium (In), tin (Sn), gallium (Ga), and hafnium (Hf). For example, the channel layer 104 may be made of indium-gallium-zinc oxide (IGZO), indium-zinc-tin oxide (IZTO), or indium-aluminum-zinc oxide (IAZO). In the present exemplary embodiment, the channel layer 104 is made of IGZO.

The ohmic contact layer 105 is made of a metal oxide material containing zinc, such as indium-zinc oxide (IZO), gallium-zinc oxide (GZO), aluminum-zinc oxide (AZO), and the like. In the present exemplary embodiment, the ohmic contact layer 105 is made of IZO. Compared to IZO, IGZO generally has an electrical resistance greater than electrical resistance of IZO. An electrical conductivity of the ohmic contact layer 105 is greater than an electrical conductivity of the channel layer 104 but is less than an electrical conductivity of the source electrode 1061 and the drain electrode 1062. Thus, electron mobility between the source electrode 1061/the drain electrode 1062 and the channel layer 104 is improved by the ohmic contact layer 105, and electric carriers are more easily injected into the channel layer 104.

In some instances, the etching rate of indium component is lower than the etching rate of zinc component with respect to the etchant employed. For example, the etchant may contain a certain proportion of phosphoric acid, nitric acid and acetic acid. While indium (In) generally offers superior electrical conductivity, a delicate balance between the content ratio of indium (In) and zinc (Zn) is required to strike a practical compromise between the electrical conductivity characteristics of the channel layer 104 and the ohmic contact layer 105 and the processability thereof.

In the present exemplary embodiment, the channel layer 104 is made of IGZO and the ohmic contact layer 105 is made of IZO. The channel layer 104 has a zinc atomic percentage of less than 35%, and the ohmic contact layer 105 has a zinc atomic percentage of more than 65%. Furthermore, a ratio of the number of indium atoms to zinc atoms in the channel layer 104 is in a range from about 1:1 to about 2:1 and a ratio of the number of indium atoms to zinc atoms in the ohmic contact layer 105 is in a range from about 9:20 to about 7:10. Thus, etching the channel layer 104 is more difficult than etching the ohmic contact layer 105 during the patterning process.

Figure 4:
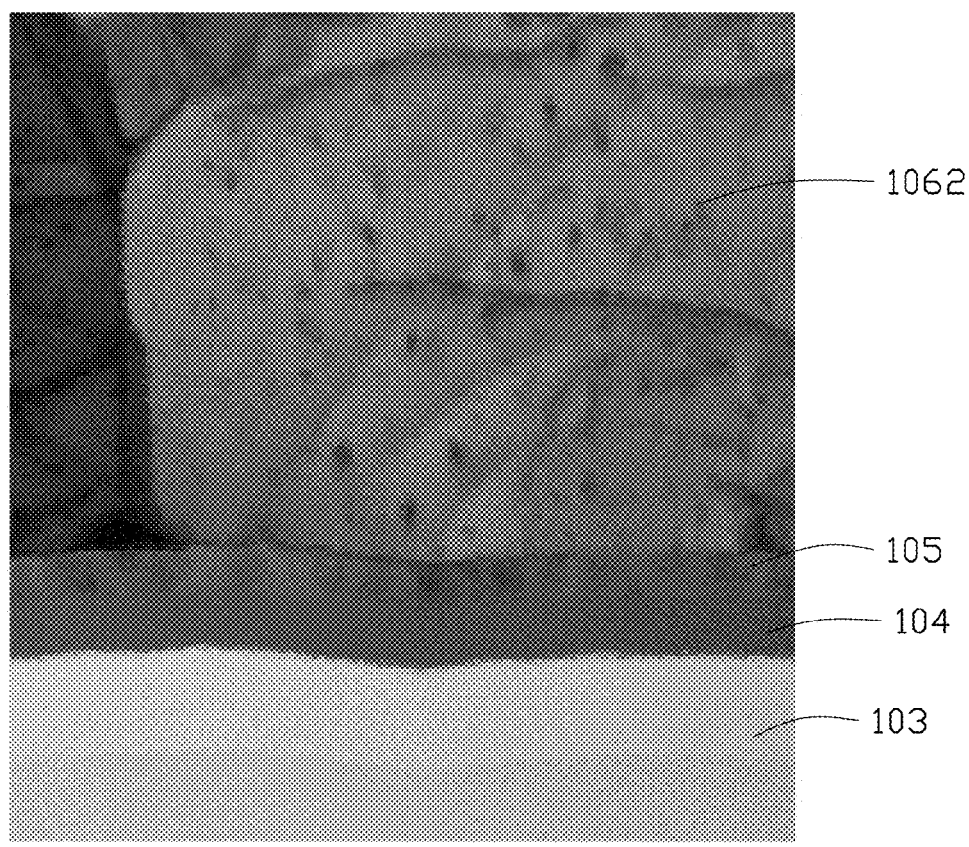
FIG. 4 is an electron microscopy view of portion IV of FIG. 3.
Figure 5:
FIG. 5 is an electron microscopy view of portion V of FIG. 3.

As shown in FIG. 4 and FIG. 5, the ohmic contact layer 105 bonds firmly to the channel layer 104. As both the ohmic contact layer 105 and the channel layer 104 are made of a metal oxide material containing zinc, the ohmic contact layer 105 and the channel layer 104 can be formed by a single patterning process. Thus, the surface region of the channel layer 104 covered by the ohmic contact layer 105 can be effectively protected by the ohmic contact layer 105. Surface defects on the surface region of the channel layer 104 covered by the ohmic contact layer 105 can be effectively reduced and contact resistance between the ohmic contact layer 105 and the channel layer 104 can be reduced.

Figure 7:
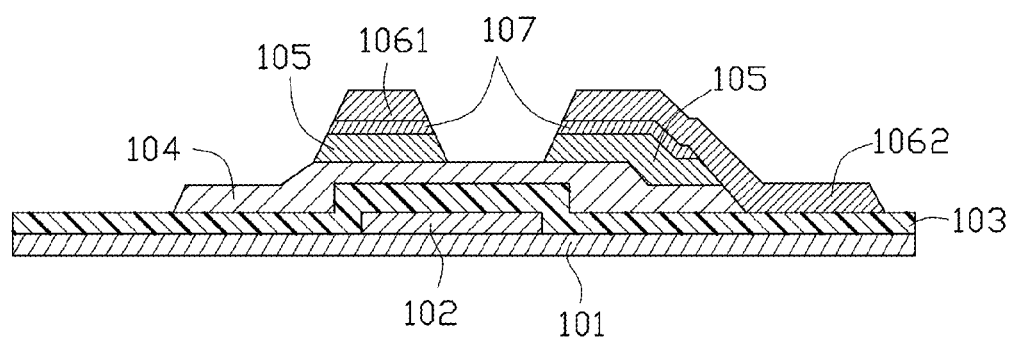
FIG. 7 is a cross-sectional view of a second exemplary embodiment of the TFT substrate of FIG. 2 along line III-III.

FIG. 7 illustrates a TFT substrate 2 according to a second exemplary embodiment. The TFT substrate 2 is substantially the same as the TFT substrate 1, except that the TFT substrate 2 further includes a barrier layer 107 between the ohmic contact layer 105 and the source electrode 1061. The barrier layer 107 is also between the ohmic contact layer 105 and the drain electrode 1062. The groove 108 extends through the barrier layer 107 and the ohmic contact layer 105 to expose the channel layer 104. The groove 108 tapers along a direction facing towards the channel layer 104.

The barrier layer 107 is made of metal or metal alloy, such as titanium (Ti) and molybdenum (Mo). The barrier layer 107 prevents the material in the source electrode 1061 and the drain electrode 1062 diffusing into the ohmic contact layer 105 and thus avoids adversely affecting the performance of the TFT element 100.

FIG. 8 through FIG. 11 illustrate a method for making a TFT substrate 1 according to an exemplary embodiment.

Figure 8:
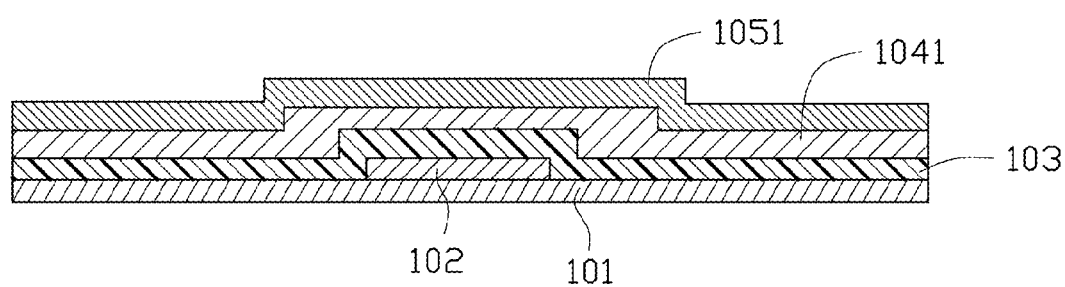
FIGS. 8 through 11 are cross-sectional views showing the sequential steps for making the TFT substrate of FIG. 4.

Step S1: as shown in FIG. 8, a substrate 101 is provided, a first conductive layer (not shown) is formed on a surface of the substrate 101 and the first conductive layer is patterned to form a gate electrode 102. A gate insulating layer 103, a semiconductor layer 1041, and a metal oxide layer 1051 are sequentially formed on the substrate 101 and the gate electrode 102. Both the semiconductor layer 1041 and the metal oxide layer 1051 are made of a metal oxide material containing zinc.

In the present exemplary embodiment, the semiconductor layer 1041 is made of IGZO and the metal oxide layer 1051 is made of IZO. The semiconductor layer 1041 has a zinc atomic percentage of less than 35%, and the metal oxide layer 1051 more than 65% atomic percentage. Furthermore, a ratio of the number of indium atoms to zinc atoms in the semiconductor layer 1041 is in a range from about 1:1 to about 2:1; and a ration of the number of indium atoms to zinc atoms in the metal oxide layer 1051 is in a range from about 9:20 to about 7:10.

Figure 9:
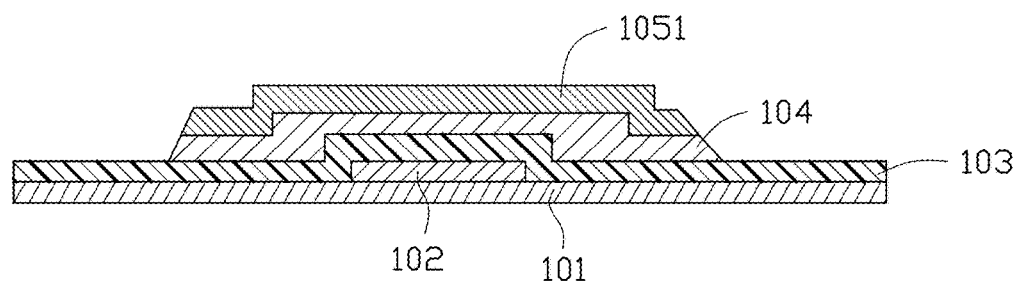

Step S2: as shown in FIG. 9, the semiconductor layer 1041 and the metal oxide layer 1051 are patterned to remove a portion of the semiconductor layer 1041 and the metal oxide layer 1051. The remaining semiconductor layer 1041 forms the channel layer 104. The channel layer 104 and the remaining metal oxide layer 1051 correspond to the gate electrode 102 and partially cover gate insulating layer 103.

Figure 10:
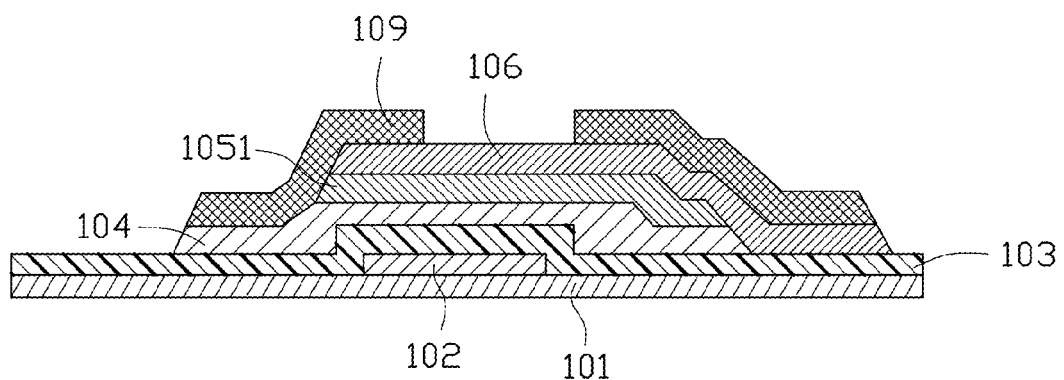
Figure 11:
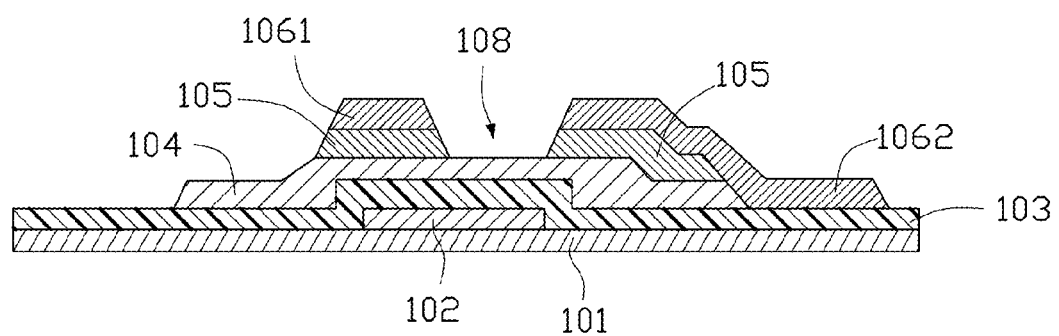

Step S3: as shown in FIG. 10 and FIG. 11, a second conductive layer 106 is formed on the metal oxide layer 1051 and is etched to form a groove 108 extending through the second conductive layer 106 and the metal oxide layer 1051. The second conductive layer 106 is made of one or more materials selected from a group consisting of Al, Ag, Au, Co, Cr, Cu, In, Mn, Mo, Ni, Nd, Pd, Ti, W, and Zn.

The remaining second conductive layer 106 forms a source electrode 1061 and a drain electrode 1062 spaced apart from each other by the groove 108. The metal oxide layer 1051 which remains after etching forms the ohmic contact layer 105. The ohmic contact layer 105 is divided into two portions separated from each other by the groove 108. One portion of the ohmic contact layer 105 is between the source electrode 1061 and the channel layer 104, and another portion of the ohmic contact layer 105 is between the drain electrode 1062 and the channel layer 104.

The etching process of the second conductive layer 106 may use a photoresist layer 109 as a shielding mask and an etchant to etch the portion of the second conductive layer 106 not covered by the photoresist layer 109. The etchant may contain a certain proportion of phosphoric acid, nitric acid, and acetic acid. The etchant etches not only the metallic second conductive layer 106 but also the metal oxide layer 1051 having a high zinc atomic content percentage. The etching rate of the second conductive layer 106 during etching process is higher than an etching rate of the metal oxide layer 1051, thus the groove 108 tapers along a direction facing towards the channel layer 104.

The etching rate of indium component is significantly lower than the etching rate of zinc component with respect to the etchant employed during the patterning process. Thus the etchant will etch the second conductive layer 106 and the metal oxide layer 1051, but causes little damage to the channel layer 104.

The method for making the TFT substrate 1 may further includes steps of forming pixel electrode and forming a passivation layer.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A thin film transistor (TFT) substrate comprising:
a substrate; and
a plurality of TFT on the substrate,
each of the plurality of TFT comprising:
a channel layer;
a source electrode and a drain electrode on opposite sides of the channel layer; and
an ohmic contact layer between the channel layer and the source electrode, and between the channel layer and the drain electrode;
wherein both the channel layer and the ohmic contact layer are made of a metal oxide containing zinc, the channel layer has a zinc atomic percentage of less than 35%, and the ohmic contact layer has a zinc atomic percentage of more than 65%.

2. The TFT substrate of claim 1, wherein the channel layer is made of indium-gallium-zinc oxide (IGZO), and the ohmic contact layer is made of indium-zinc oxide (IZO).

3. The TFT substrate of claim 2, wherein a ratio of the number of indium atoms to zinc atoms in the channel layer is in a range from about 1:1 to about 2:1; and a ratio of the number of indium atoms to zinc atoms in the ohmic contact layer is in a range from about 9:20 to about 7:10.

4. The TFT substrate of claim 1, wherein the source electrode and the drain electrode are spaced apart from each other by a groove, the groove extends through the ohmic contact layer to expose the channel layer.

5. The TFT substrate of claim 4, wherein the groove tapers along a direction facing towards the channel layer.

6. The TFT substrate of claim 1, wherein each of the plurality of TFT further comprises a barrier layer, the barrier layer is between the source electrode and the ohmic contact layer, and is between the drain electrode and the ohmic contact layer.

7. The TFT substrate of claim 6, wherein the source electrode and the drain electrode are spaced apart from each other by a groove; the groove extends through the barrier layer and the ohmic contact layer to expose the channel layer; the groove tapers along a direction facing towards the channel layer.

8. The TFT substrate of claim 6, wherein the barrier layer is made of metal or alloy.

9. The TFT substrate of claim 1, wherein the source electrode and the drain electrode is made of metal or alloy.

10. A method for making a TFT substrate comprising:
providing a substrate;
forming a channel layer on the substrate, the channel layer being made of a metal oxide containing zinc and having a zinc atomic percentage of less than 35%;
forming an ohmic contact layer on the channel layer, the ohmic contact layer being made of a metal oxide containing zinc and having a zinc atomic percentage of more than 65%;
forming a conductive layer on the ohmic contact layer;
etching the conductive layer to define a groove extending through the conductive layer and the ohmic contact layer, the remaining conductive layer forming a source electrode and a drain electrode spaced apart from each other by the groove.

11. The method for making a TFT substrate of claim 10, wherein the channel layer is made of indium-gallium-zinc oxide (IGZO), and the ohmic contact layer is made of indium-zinc oxide (IZO).

12. The method for making a TFT substrate of claim 11, wherein a ratio of the number of indium atoms to zinc atoms in the channel layer is in a range from about 1:1 to about 2:1; and a ratio of the number of indium atoms to zinc atoms in the ohmic contact layer is in a range from about 9:20 to about 7:10.

13. The method for making a TFT substrate of claim 10, wherein the groove tapers along a direction facing towards the channel layer.

14. The method for making a TFT substrate of claim 10, wherein the barrier layer is made of metal or alloy.

15. The method for making a TFT substrate of claim 10, wherein the source electrode and the drain electrode is made of metal or alloy.

* * * * *